(12) United States Patent
Miyamoto et al.

(10) Patent No.: US 7,764,826 B2
(45) Date of Patent: Jul. 27, 2010

(54) METHOD AND APPARATUS OF REVIEWING DEFECTS ON A SEMICONDUCTOR DEVICE

(75) Inventors: Atsushi Miyamoto, Yokohama (JP); Toshifumi Honda, Yokohama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 901 days.

(21) Appl. No.: 11/634,963

(22) Filed: Dec. 7, 2006

(65) Prior Publication Data

US 2007/0145270 A1  Jun. 28, 2007

(30) Foreign Application Priority Data

Dec. 7, 2005  (JP)  ............... 2005-352843

(51) Int. Cl.
*G06K 9/00* (2006.01)

(52) U.S. Cl. .............. 382/149; 250/559.41; 250/559.45

(58) Field of Classification Search ....................... None
See application file for complete search history.

(56) References Cited

U.S. PATENT DOCUMENTS

| 6,167,355 | A * | 12/2000 | Fiekowsky | .................. 702/159 |
| 6,633,174 | B1 * | 10/2003 | Satya et al. | ................ 324/751 |
| 7,231,079 | B2 * | 6/2007 | Okuda et al. | ............... 382/145 |

FOREIGN PATENT DOCUMENTS

| JP | 2000-030652 | 1/2000 |
| JP | 2000-348658 | 12/2000 |
| JP | 2001-331784 | 11/2001 |
| JP | 3255292 | 2/2002 |
| JP | 2003-098114 | 4/2003 |

OTHER PUBLICATIONS

English machine translation of JP 2001-331784, to Akira et al., published on Nov. 30, 2001, translation pp. 1-14 to 14-14.*

* cited by examiner

*Primary Examiner*—Brian P Werner
(74) *Attorney, Agent, or Firm*—Antonelli, Terry, Stout & Kraus, LLP.

(57) ABSTRACT

To realize reliable on-film/under-film defect classification (classification into 3 classes of on-film, under-film, and determination-disabled) with determination propriety determination, an on-film/under-film defect classification method and a method of narrowing a range of defect generation timing are given, the methods being robust to 4 variation factors, wherein an edge of a boundary line between a line pattern region and a base region is focused, and whether the edge is preserved between defect and reference images in a defective region is determined, thereby an on-film or under-film defect can be identified. Furthermore, a range of the defect generation timing can be narrowed based on an identification result of the on-film or under-film defect, and information of a defect classification class (defect type) such as particle defect or pattern defect as necessary.

14 Claims, 12 Drawing Sheets

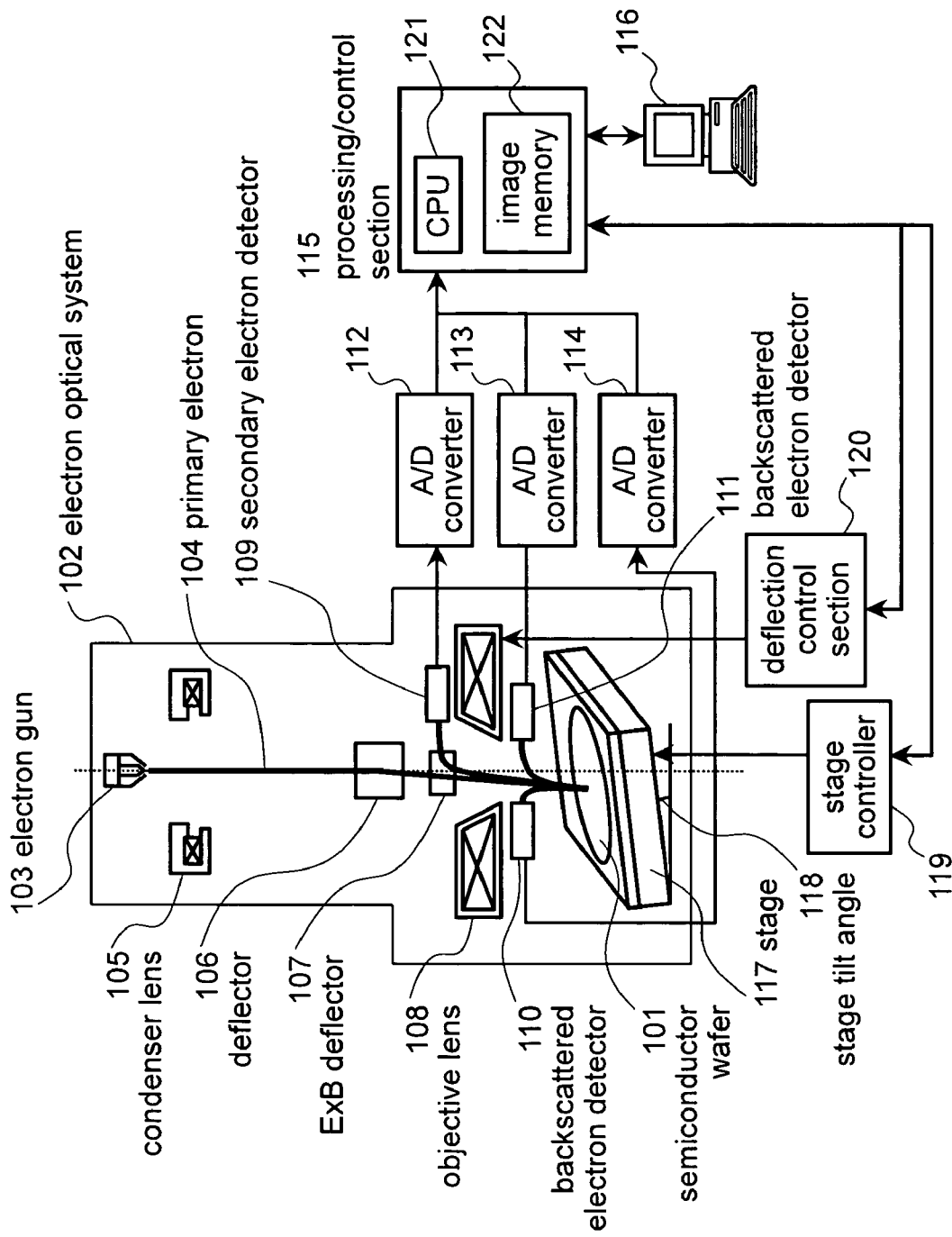

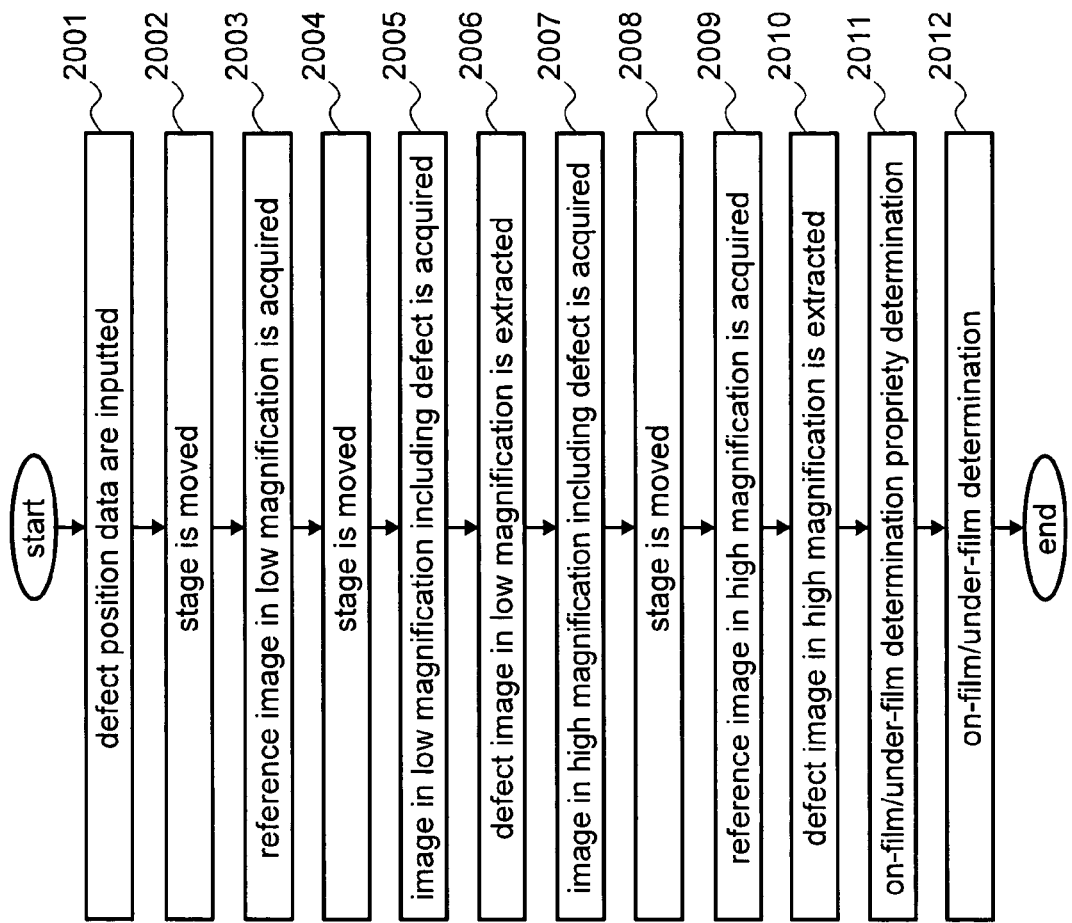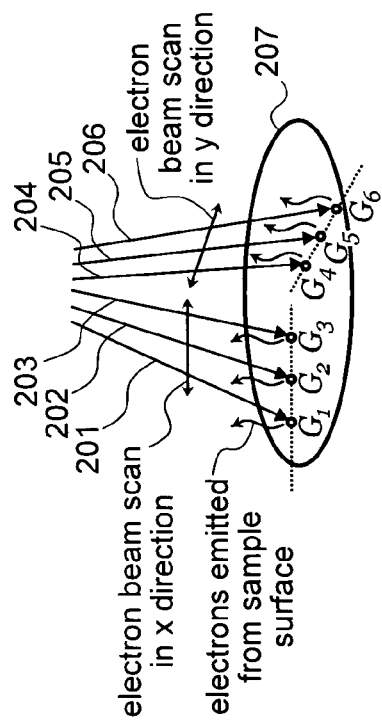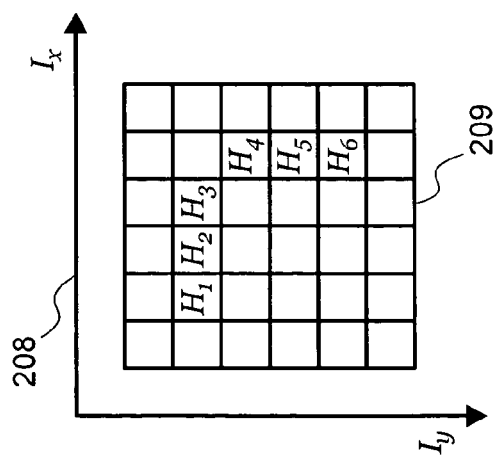

FIG.5(a)   FIG.5(b)   FIG.5(c)
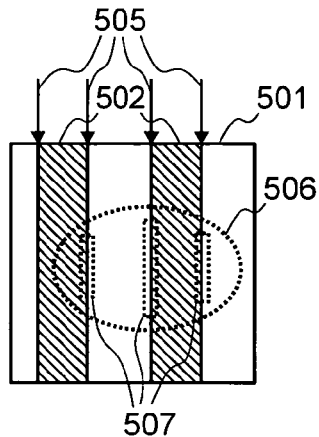
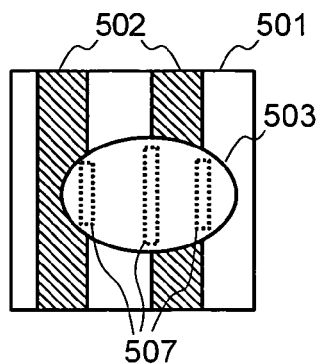
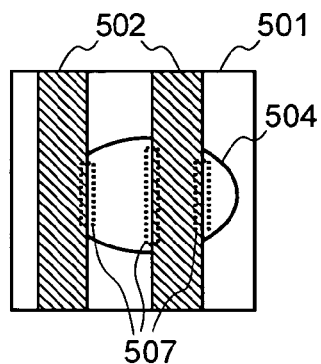
FIG.6
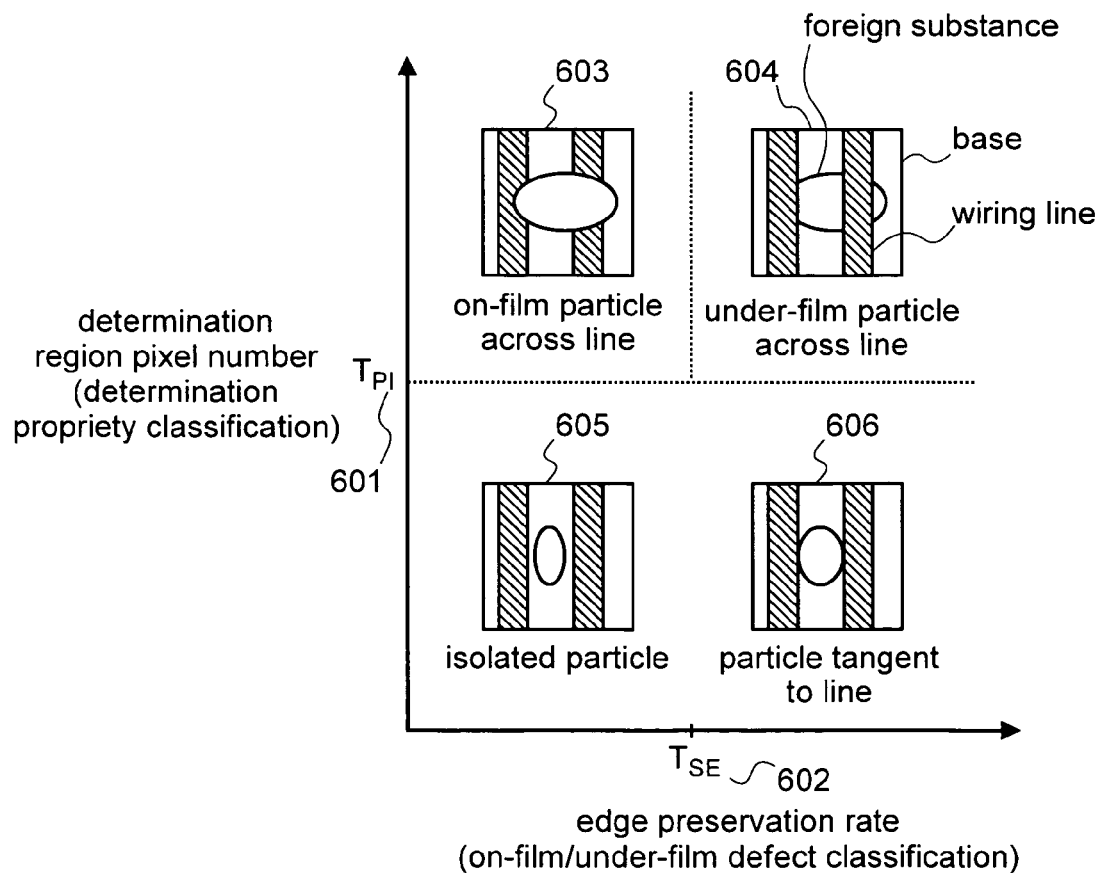

defect binary-image C defect binary-image C1 defect binary-image C2

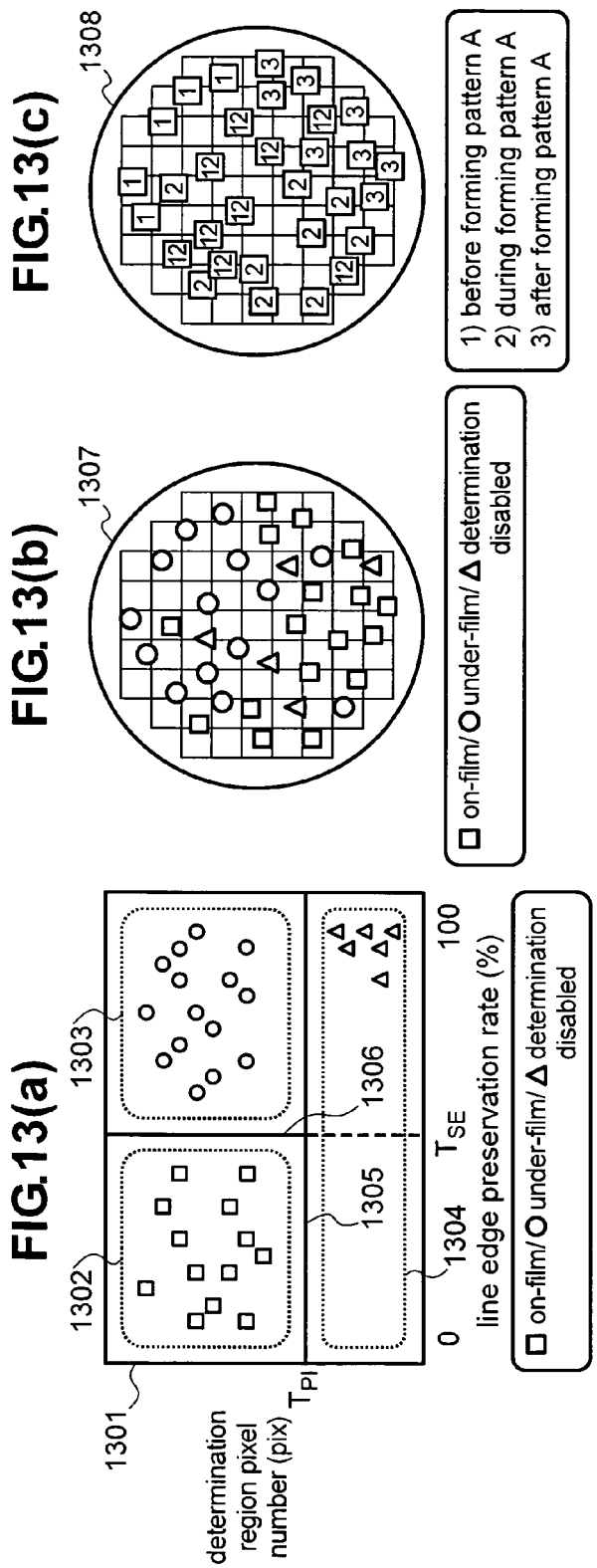
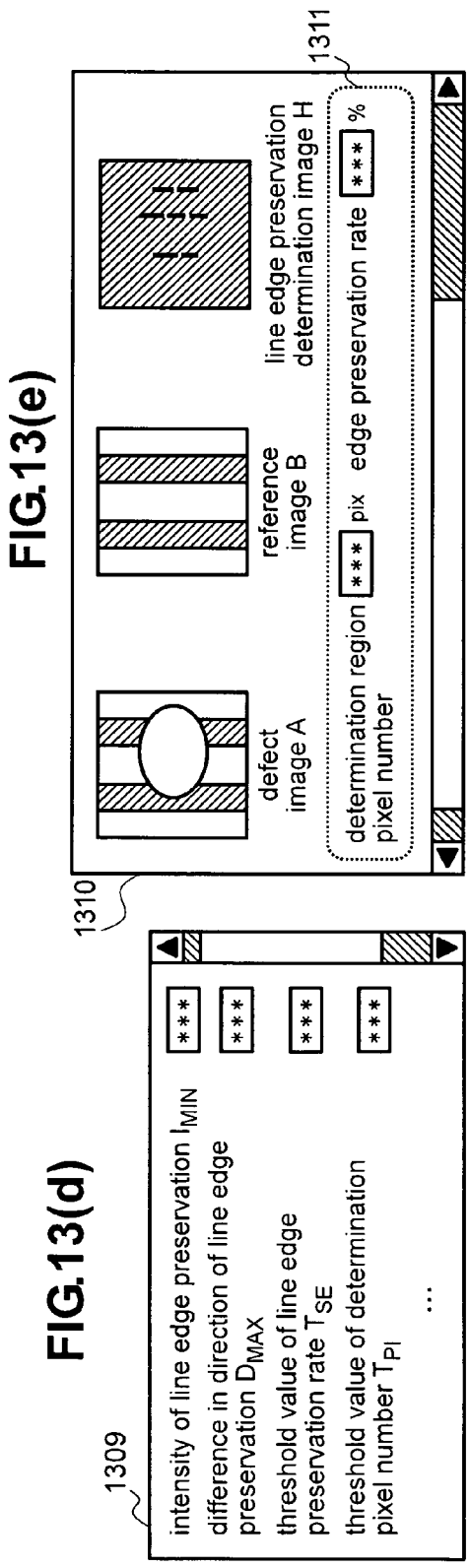

METHOD AND APPARATUS OF REVIEWING DEFECTS ON A SEMICONDUCTOR DEVICE

BACKGROUND OF THE INVENTION

The present invention relates to a method and apparatus of reviewing defects, which acquire a detailed image of defects on a semiconductor wafer inspected by another inspection apparatus and reviews the defects, and particularly relates to a method and apparatus of reviewing defects, which perform automatic defect classification (ADC) for identifying an adhesion process of defects in a semiconductor manufacturing process from images of the defects on a semiconductor wafer observed by a scanning electron microscope (SEM).

DESCRIPTION OF RELATED ART

The semiconductor device is manufactured by repeatedly performing a plurality of manufacturing steps to a wafer to be a substrate, such as steps of deposition, resist coating, exposure, development, and etching, and after treatment in each of predetermined steps among the plurality of treatment steps, identification of positions or inspection of size of defects is performed using optical or SEM-type defect inspection apparatus. Since the number of detected defects may be several hundreds to several thousands per wafer, fast defect detection is required for the defect inspection apparatus.

On the contrary, in some cases, a defect position detected by the defect inspection apparatus is imaged using SEM-type defect review apparatus having higher magnification for more detailed analysis of defects. As the defect review apparatus, a product has been developed, which has automatic defect review (ADR) for automatically acquiring an expanded image of a defect based on defect position information from the defect inspection apparatus, for example, by a method described in JP-A-2000-30652, or automatic defect classification (ADC) for automatically determining a defect classification class and outputting it, for example, by a method described in JP-A-2001-331784.

For prompt setup and improvement in yield of a semiconductor manufacturing process, analysis of a generation source of a defect or yield prediction in the semiconductor manufacturing process, and furthermore a prompt measure for a problematic process based on the analysis are necessary. As a system for performing defect classification based on inspection information obtained by the defect inspection apparatus or defect reviewing apparatus, and analyzing a relationship with a yield, a configuration as described in Japanese Patent No. 3255292 is given. A column for charged particle beam apparatus is disclosed in JP-A-2000-348658.

As a typical example of an effective defect classification standard in identifying the problematic process, classification for each defect generation source (particle defect due to dusting, scratch defect due to polishing, or pattern defect due to patterning), classification for each electric characteristic (short defect or open defect of a lower layer), and classification for each adhesion timing of a particle defect or generation timing of the pattern defect (defects on/under a surface layer of a line pattern, hereinafter called "on-film/under-film defects") are given. An ADC technique for automating such classification operation is desired to be established for achieving speed up of identification of the problematic process and manpower saving in the identification. Particularly in defect classification classes as above, when the on-film/under-film defect classification is realized, an effective determination source is given for identifying the problematic process. However, reliable on-film/under-film defect classification has been difficult because of the following variation factors.

SUMMARY OF THE INVENTION

An embodiment of the invention relates to a method of the on-film/under-film defect classification being robust to the following variation factors, and provides a method of performing the on-film/under-film defect classification using processing parameters being reliable, and highly versatile among a plurality of manufacturing processes.

(1) Defocusing or noises in a SEM image.

(2) Variation in texture (pattern) of a defect surface.

(3) Variation in brightness value of an image caused by difference in scattering condition of an electron beam due to presence of a defect or a shape of the defect.

(4) Deformation of a shape of an edge of a peripheral line pattern by a defect.

Furthermore, an embodiment of the invention provides a method of narrowing a range of defect generation timing from a result of on-film/under-film defect classification.

An embodiment of the invention relates to a method and apparatus of on-film/under-film defect determination, having the following features.

An embodiment of the invention is a defect classification method focused on a boundary line (hereinafter, called "line edge") between a line pattern region and a base region, wherein a region (hereinafter, called "determination region") in which the line edge exists in a reference image is calculated in a defective region, then a ratio of detecting the line edge (hereinafter, called "edge preservation rate") is similarly calculated in a region of a defect image corresponding to the determination region, and then on-film/under-film determination is performed depending on magnitude of the edge preservation rate.

That is, the classification method is focused on a point that since the on-film defect generated after forming line pattern exists in an upper part with respect to the line pattern, a line edge can not be observed in the defective region, and on the other hand, the line edge can be observed in a defective region of an under-film defect generated before forming line patterns. In the method, determination propriety determination is involved, in which an isolated defect having a defective region being not ranged to the line edge is determined to be determination disabled, and a defect that was determined to be determination disabled can be classified by a different classification method.

Determination whether the line edge is preserved between the reference and defect images is necessary for calculating the edge preservation rate, and edge preservation determination that combines preservation determination based on a plurality of evaluation indexes is performed. As the preservation determination based on the plurality of evaluation indexes, determination whether intensity of an edge component calculated from the defect image and the reference image is preserved between the defect and the reference images, or determination whether a direction of the edge component is similarly preserved between the defect and the reference images is given.

For calculating the determination region, first, presence of a defect or the defective region corresponding to deformation in shape of a pattern need to be accurately extracted, however, a line edge portion may be remained as a pseudo defect in a differential image between the defect and reference images due to difference in edge effect caused by presence of a defect or difference in shape between the defect and reference images. Thus, the edge preservation determination is performed to the defective region obtained by digitizing the deferential image, and a region where the edge is preserved is removed, thereby detection accuracy of the defective region is improved. Such a defective region detection method can be used not only for on-film/under-film classification, but also used as a defect detection method in typical ADR or ADC.

In the case that line edge is deformed by the under-film defect, the edge also needs to be determined to be preserved, therefore the preservation determination of the line edge is similarly performed to the periphery of a focused pixel in the determination region to be subjected to determination, and when a peripheral pixel satisfying a preservation determination condition exists, the edge is determined to be preserved in the focused pixel.

Automatic defect classification of various defect classification classes including the on-film/under-film defect classification is performed by, assuming that the edge preservation rate or the number of pixels in the determination region is an image feature quantity, a classification engine in a rule base type based on the image feature quantity, or a classification engine in a learning type based on the image feature quantity, or a classification engine in a combination of the rule base type and the learning type. Moreover, a classification standard can be established including another image feature quantity (such as image brightness value) in addition to the edge preservation rate and the number of pixels in the determination region as the image feature quantity.

In estimation of defect generation timing, even in the case of the same on-film or under-film defect, if defect generation sources such as the particle defect or pattern defect are different, estimation results of the defect generation timing may be different. Thus, an embodiment of the invention identifies the defect generation timing based on a classification result of the on-film/under-film defects, and information of the defect classification classes (defect types) such as the particle defect or pattern defect as necessary.

The method of on-film/under-film defect classification of an embodiment of the invention enables accurate on-film/under-film defect classification being not influenced by the following items:

(1) defocusing or noises in a SEM image;

(2) variation in texture of a defect surface;

(3) variation in brightness value of an image caused by difference in scattering condition of an electron beam due to presence of a defect or a shape of the defect; and (4) deformation of a shape of an edge of a peripheral line pattern by a defect.

The treatment of removing a remnant of the line edge due to the edge effect as an approach for realizing the item (3) leads to improvement in accuracy of defect detection, which further leads to improvement in accuracy of the on-film/under-film defect classification, but also leads to realizing improvement in accuracy of defective region imaging, defect size measurement, calculation of an image feature quantity of a defective region, and defect classification in typical ADR or ADC.

A method that combines the preservation determination based on the plurality of evaluation indexes is used for the preservation determination of the line edge between the reference and defect images, which is necessary for the on-film/under-film defect classification method, thereby a case can be suppressed, the case being a case that an edge is determined to be preserved by mistake due to an accidental edge caused by a texture or the like in separate determination.

By using the determination propriety determination, whether reliable classification is possible using the on-film/under-film defect classification method of an embodiment of the invention can be automatically determined. Thus, purity of accuracy rate of the on-film/under-film defect classification can be improved, and furthermore by using the on-film/under-film defect classification method of an embodiment of the invention, processing branch for classifying a sample hard to be classified by a different classification method can be efficiently performed.

The defect generation timing can be identified or narrowed based on the classification result of the on-film/under-film defects, and information of the defect classification classes (defect types) such as the particle defect or pattern defect as necessary. In addition to this, defect distribution information, defect composition information, and apparatus history information are combined, thereby accurate yield prediction or identification of a problematic process is realized, leading to an efficient measure for the problematic process.

These and other objects, features and advantages of the invention will be apparent from the following more particular description of preferred embodiments of the invention, as illustrated in the accompanying drawings.

BRIEF DESCRIPTION OF THE DRAWINGS

FIG. 1 shows a system block diagram showing an example of a system for reviewing a defect;

FIG. 2(a) shows a perspective view of a sample showing a scan direction of an electron beam and a state of electrons emitted from a surface of the sample;

FIG. 2(b) shows a schematic view showing two-dimensional information of image data;

FIG. 2(c) shows a flowchart showing a processing flow of defect review;

FIG. 5(a) shows a view showing a reference image (normal pattern);

FIG. 5(b) shows a defect image in a condition that a particle exists on a film;

FIG. 5(c) shows a defect image in a condition that a particle exists under a film;

FIG. 6 shows a view showing defect classification classes;

FIG. 13(a) shows a distribution view showing a relationship between an edge preservation rate and a determination region pixel number;

FIG. 13(b) shows a wafer map view indicating positions of defects on a wafer and a classification result in a set;

FIG. 13(c) shows a wafer map view indicating positions of defects on a wafer and an estimation result of generation timing of the defects in a set;

FIG. 13(d) shows a view showing an example of a screen for setting and displaying image processing parameters and threshold values;

FIG. 13(e) shows a view showing an example of GUI for displaying a defect image, reference image, and processed image of a sample;

DESCRIPTION OF THE PREFERRED EMBODIMENTS

Figure 3A:
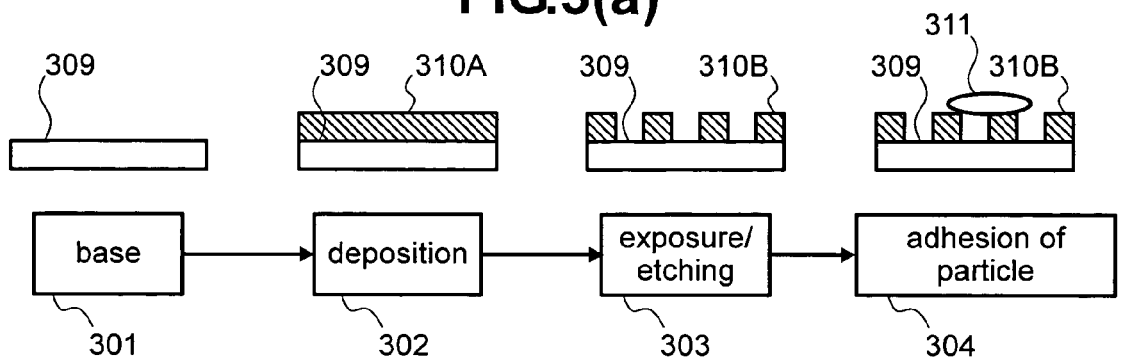
FIG. 3(a) shows a view showing a schematic flow of a process of forming a gate pattern and a cross section of a sample in each step in the case that a particle is generated on a film of the sample.
Figure 3B:
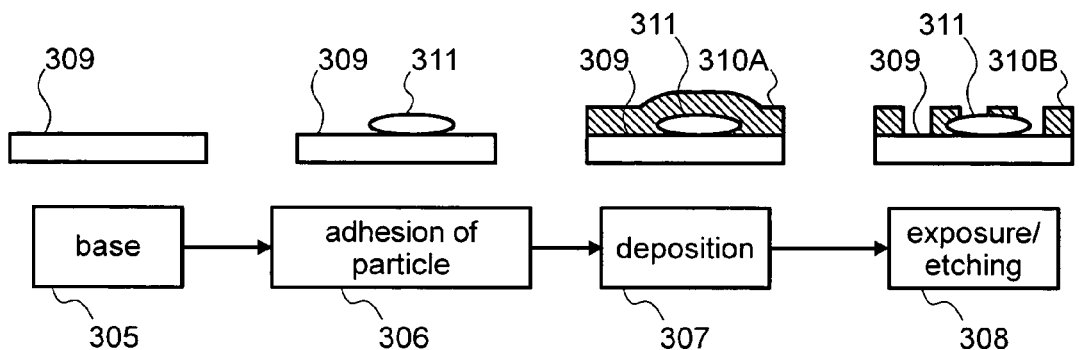
FIG. 3(b) shows a view showing a schematic flow of a process of forming a gate pattern and a cross section of a sample in each step in the case that a particle is generated under a film of the sample.

An embodiment of the invention will be described using FIGS. 1 to 14. As an embodiment, while a defect type in on-film/under-film defect classification is described using the particle defect as an example in the following description, an embodiment of the invention can similarly use the pattern defect or the like as the defect type.

1. Apparatus Configuration

FIG. 1 shows a block of an outline of a configuration of review SEM apparatus having a scanning electron microscope (SEM) for acquiring a secondary electron image (SE image) or a backscattered electron image (BSE image) of a sample. The SE image and the BSE image are collectively called SEM image. Moreover, images acquired herein include part or all of top down images as images of a measurement object observed in a vertical direction, or tilt images as images of the object observed in a direction of any optional inclination angle.

A reference 103 indicates an electron gun for generating an electron beam (primary electrons) 104. An irradiation position and narrowing of the electron beam are controlled using a deflector 106 and an objective lens 108 such that the electron beam is focused and irradiated at an optional position on a semiconductor wafer 101 as a sample placed on a stage 117. Secondary electrons and backscattered electrons are emitted from the semiconductor wafer 101 irradiated with the electron beam, and the secondary electrons are detected by a secondary electron detector 109. On the other hand, the backscattered electrons are detected by backscattered electron detectors 110 and 111. The backscattered electron detectors 110 and 111 are set in different directions from each other. The secondary electrons and the backscattered electrons detected by the secondary electron detector 109 and the backscattered electron detectors 110 and 111 are converted into digital signals by A/D converters 112, 113 and 114, then the signals are stored in an image memory 122 for image processing by CPU 121 according to a purpose.

FIGS. 2(a) and 2(b) show a method of imaging signal levels of electrons emitted from a surface of a semiconductor wafer when an electron beam is scanned and irradiated on the semiconductor wafer. For example, as shown in FIG. 2(a), the electron beam is irradiated with being scanned in x and y directions as shown by references 201 to 203 or 204 to 206. A scan direction can be changed by changing a deflection direction of the electron beam. Points on the semiconductor wafer irradiated with electron beams 201 to 203 being scanned in the x direction are indicated by references G1 to G3 respectively. Similarly, points on the semiconductor wafer irradiated with electron beams 204 to 206 being scanned in the y direction are indicated by references G4 to G6 respectively. Signal levels of electrons emitted at the points G1 to G6 correspond to brightness values of pixels H1 to H6 in an image 209 shown in FIG. 2(b) respectively (lower right subscripts 1 to 6 are corresponding to each other in G and H) A reference 208 indicates coordinates showing x and y directions on an image.

A reference 115 in FIG. 1 indicates a computer system that performs processing or control for taking an image, such as sending a control signal to a stage controller 119 or a deflection control section 120, or performing various kinds of image processing including on-film/under-film defect classification of an embodiment of the invention to an observed image on the semiconductor wafer 101. The processing/control section 115 is connected to a display 116, and has GUI (Graphic User Interface) for displaying an image for a user. A reference 117 indicates an XY stage for moving the semiconductor wafer 101 to enable taking an image at any position on the semiconductor wafer. Change of an observation position using the XY stage 117 is called stage shift, and change of the observation position using the deflector 106 is called beam shift.

While an embodiment having two detectors of the backscattered electron image (shading image) was shown in FIG. 1, the number of the detectors of the backscattered electron image can be decreased or increased. Moreover, part or all of the processing or control of the computer system 115 can be allocated to a plurality of different processing terminals. As a method of acquiring a tilt image of a measurement object in a direction of any optional inclination angle using the apparatus shown in FIG. 1, (1) a method of acquiring an inclined image by deflecting an electron beam to be irradiated from an electronic optical system so that an irradiation angle of the electron beam is inclined (for example, a method described in JP-A-2000-348658), (2) a method of inclining the stage 117 itself for moving the semiconductor wafer (in FIG. 1, the stage is inclined with a tilt angle 118), and (3) a method of mechanically inclining the electronic optical system itself.

FIG. 2(c) shows a flow of imaging a defect on a semiconductor wafer using the review SEM apparatus having the scanning electron microscope (SEM) as shown in FIG. 1, and classifying defect images.

First, to take an image of a defect on a semiconductor wafer, which has a comparatively high magnification, defect positional data (coordinate information) are inputted (201), the data having been previously detected by not-shown, different inspection apparatus having a comparatively low magnification (for example, an optical, light-field defect inspection apparatus or dark-field defect inspection apparatus).

Next, an image of the defect on the semiconductor wafer is acquired by SEM, however, coordinate accuracy of review apparatus does not necessarily correspond to coordinate accuracy of inspection apparatus. Therefore, even if the defect is tried to be observed by the review apparatus by controlling the stage 117 based on coordinate information of a defect position outputted from the inspection apparatus, the defect to be observed does not always exist in a visual field of the SEM. Thus, when a defect is observed by SEM based on position coordinate information of the defect inputted in 2001, it is necessary to take the image in a manner that a visual field is enlarged by reducing magnification to securely include the defect being desired to be observed in the visual field, such that the defect is in an image field of the SEM.

That is, a stage is moved (2002) based on the defect position data inputted in 2001, so that a reference image of a normal place in low magnification is acquired, the image being near the defect being desired to be detected but free from the defect, and corresponding to a position of the defect on the semiconductor wafer (2003). Next, the stage is moved (2004) based on the defect position data such that the defect being desired to be detected is in a comparatively large visual field of the SEM in low magnification, so that an image in low magnification including the defect is acquired (2005). The image in low magnification including the defect, which is acquired in this way, is compared to the reference image in low magnification, thereby a defect image in low magnification is extracted (2006).

Next, an image in high magnification including the extracted defect is acquired (2007). Then, the stage is moved (2008), so that a reference image of a normal place in high magnification is acquired, the image being near the defect but free from the defect, and corresponding to a position of the defect on the semiconductor wafer (2009). Then, the image in high magnification including the defect is compared to the reference image in high magnification, thereby a defect image in high magnification is extracted (2010).

Furthermore, on-film/under-film determination propriety determination is performed (2011), which determines whether it is possible to determine whether the defect, which was detected using the extracted defect image in high magnification and the reference image of the normal place corresponding to the position of the defect, exists on a film or under the film. For a defect that can be subjected to on-film/under-film determination, a preservation rate of an edge of a pattern included in an image of the defect is obtained for the on-film/under-film determination (2012).

2. On-Film/Under-Film Defect Classification 2. 1. On-Film/Under-Film Defect

Next, steps of the on-film/under-film determination propriety determination is performed (2011) and the on-film/under-film determination (2012) in the processing flow described in FIG. 2(c) are described in detail below. As an example of an on-film/under-film defect to be classified in an embodiment of the invention, FIGS. 3(a) to 3(b) briefly show an adhesion process of an on-film/under-film particle in a process of forming a gate pattern. A schematic view of a corresponding section profile of a wafer is shown on each of steps 301 to 304 and 305 to 308. First, as shown in FIG. 3(a), a line pattern 310B is formed by sequentially performing deposition 310A (step 302), and exposure and etching (step 303) on a base 309 (step 301). An on-film particle refers to a defect such as a particle 311 adhered after forming the line pattern 310B in this way (step 304). On the other hand, an under-film particle refers to a defect formed in a way that first the particle 311 is adhered (step 306) on the base 309 (step 305), then the deposition 310A (step 307), and the exposure and etching (step 308) are performed thereon.

Figure 4:
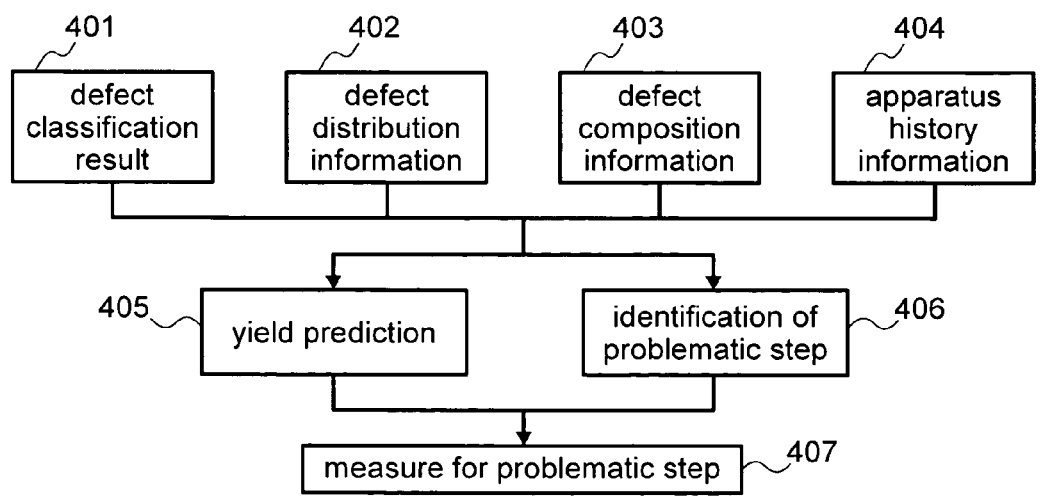
FIG. 4 shows a view showing a flow of performing yield prediction, identification of a problematic process, and a measure for the problematic process based on analysis information of a defect.

When such on-film/under-film classification of particle is enabled, identification of a step at which the particle is adhered, that is, identification of whether the particle is adhered after or before deposition is enabled, consequently an effective determination source is given for problematic process identification. In addition to an on-film/under-film classification classes, a particle determined to exist on a film and a particle determined to exist under a film are classified using different classification rules from each other, thereby more detailed classification of particle can be performed. Furthermore, as shown in FIG. 4, synthetic analysis, which combines part or all of a defect classification result 401 for various defect classification classes (defect types) or defect generation timing, defect distribution information 402, defect composition information 403, and apparatus history information 404, enables prompt and accurate yield prediction 405 or defect generation source identification 406, and furthermore a measure for a problematic process 407.

2. 2. On-Film/Under-Film Defect Classification Method 2. 2. 1. Basic Idea

FIG. 5(a) schematically shows a reference image (normal pattern, corresponding to a view made by observing the section profile shown above the step 303 in FIG. 3 from a vertically upper side with respect to a wafer surface), FIG. 5(b) schematically shows a defect image (including the on-film particle, corresponding to a view made by observing the section profile shown above the step 304 in FIG. 3 from the upper side), and FIG. 5(c) schematically shows a defect image (including the under-film particle, corresponding to a view made by observing the section profile shown above the step 308 in FIG. 3 from the upper side). A basic idea for classifying the on-film/under-film defects is described using the figures. To classify the on-film/under-film defects, boundary lines (hereinafter, called "line edges", four lines shown by a reference 505 in FIG. 5(a)) between base regions 501 and line pattern regions 502 were noticed. Line edges in a region where a particle exists can not be observed in the case of the on-film particle since a particle 503 exists on line patterns 502 as shown in FIG. 5(b). On the other hand, in the case of the under-film defect, line edges 505 can be observed while they may be somewhat deformed in shape by an under-film particle 504 situated under the edges, as shown in FIG. 5(c).

Focusing attention on such a property, regions 507 where line edges exist in the reference image (3 elongated regions enclosed by dot lines in the embodiment, hereinafter called "determination region") are calculated in the defective region (about the region where the defect 503 or 504 exists, a circular frame region 506 enclosed by a dot line in FIG. 5(a) in the reference image), and in the regions corresponding to the determination regions 507 in the defect image, a ratio of detecting the line edges (hereinafter, called "edge preservation rate") is similarly calculated, and the on-film/under-film defect determination can be performed depending on magnitude of the edge preservation rate.

As shown in FIG. 6, assuming that a particle having the edge preservation rate of less than an optional threshold value $T_{SE}$ (602) is an on-film particle 603, and a particle having the rate of more than the value is an under-film particle 604, both the particle are classified. A particle isolating from the line pattern regions as shown in a defect image 605 can be classified to be determination disabled, since the determination region does not exist. Moreover, a particle tangent to the line pattern regions as shown in a defect image 606 can be classified to be determination disabled to positively avoid lowly reliable determination, since a determination region pixel number is extremely small. Here, a threshold value $T_{PI}$ (601) is set, and a case that the determination region pixel number is less than $T_{PI}$ is assumed to be determination disabled.

2. 2. 2. Classification Processing Flow

Figure 7:
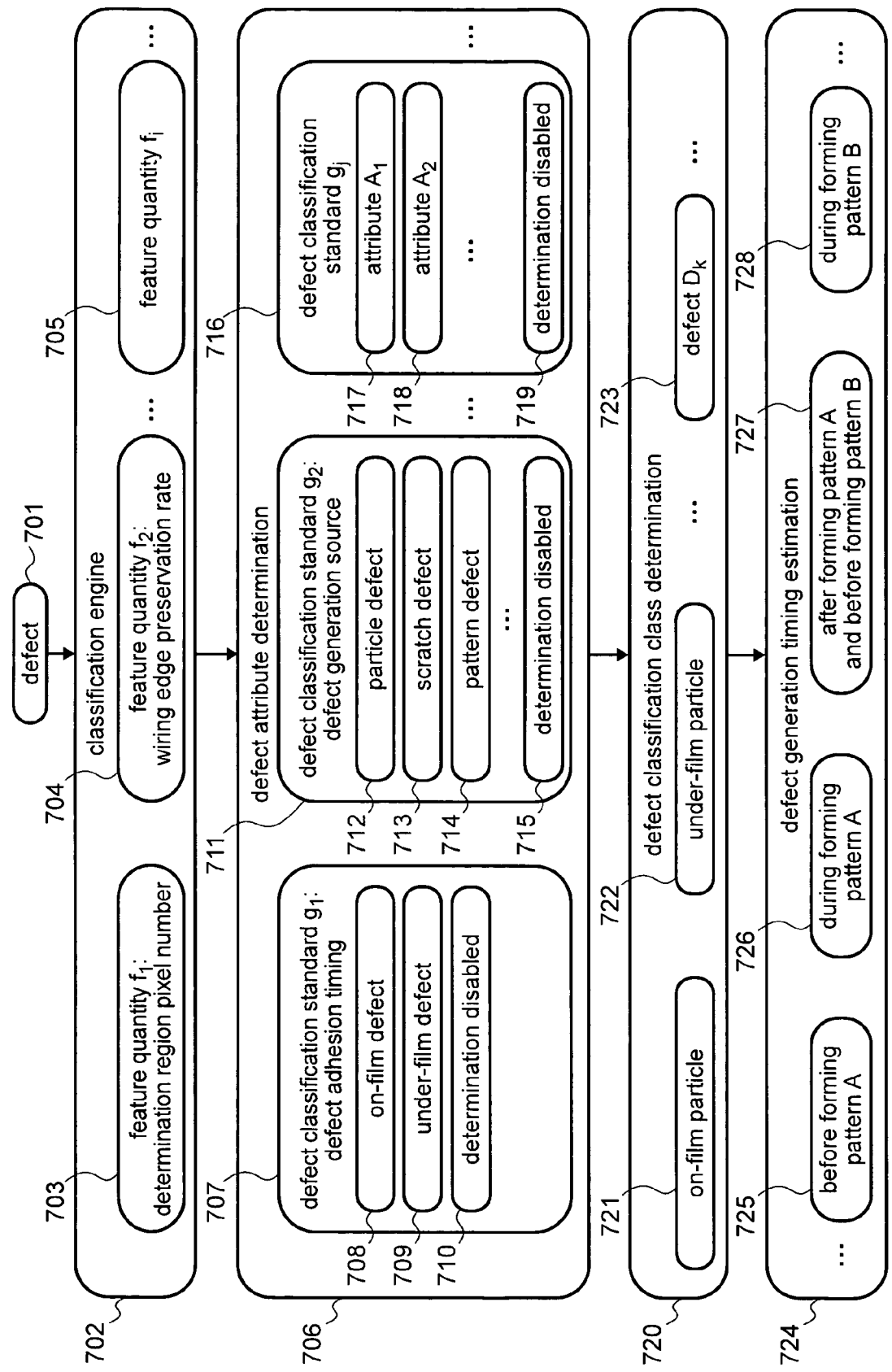
FIG. 7 shows a view showing a classification processing flow of defect classes or defect generation timing.

FIG. 7 shows a processing flow example for estimating classification into various defect classification classes including the on-film/under-film defect determination and defect generation timing. A defect 701 is subjected to classification using a classification engine 702 to determine an attribute 706 of the defect. In the classification engine, any combination of a determination region pixel number 703 (mentioned as feature quantity $f_1$), a line edge preservation rate 704 (mentioned as feature quantity $f_2$), and another optional feature quantity $f_i$ 705 (i=1 to I) can be used as criteria of determination of the attribute. Detail of calculation methods of the determination region pixel number 703 and the line edge preservation rate 704 are described later. Examples of another optional feature quantity $f_i$ 705 include any optional feature quantity for evaluating a brightness pattern of an image such as brightness of an image or a differential value between left and right, two shading images.

As typical examples of attributes of a defect, an attribute 707 on defect adhesion timing (on-film defect 708 or under-film defect 709) (mentioned as defect classification standard $g_1$), an attribute on defect generation sources (particle defect 712, scratch defect 713, or pattern defect 714) (mentioned as defect classification standard $g_2$), and an attribute 716 on other optional defect classification standard $g_j$ (attribute $A_1$, attribute $A_2$, . . . ) (j=1 to J) are given. When an attribute class can not be determined or a relevant attribute class does not exist in each kinds of attribute classification 707, 711, and 716, an attribute of determination disabled 710, 715 and 719 is given for the kinds of attribute classification respectively.

Defects can be classified into respective defect classes (defect types 721 to 723) in step 720 based on a plurality of the attributes. For example, a defect in which the attribute on defect adhesion timing is "on-film defect", and the attribute on defect generation sources is "particle defect" is classified into an on-film particle 721. Feature quantities, defect attributes, and defect classes in FIG. 7 are shown as an example, and further multiple feature quantities or attributes can be added, so that defects can be classified into more detailed defect classes.

Estimation of defect generation timing is performed in step 724 based on the defect attribute in the step 706, or the defect classification class in the step 720. For example, defect generation timing is estimated in a way that a defect was generated or adhered before forming a pattern A (725), or generated during forming the pattern A (726), in patterns A, B, . . . sequentially formed in a stacked direction in a semiconductor manufacturing process. Sometimes, the estimation is performed as estimation of several generation timing candidates (narrowing generation timing) such as defect generation before forming the pattern A or defect generation during forming the pattern A. Detail of the step 724 is described later using FIG. 15. Based on a defect classification result on the defect classification class (defect type) or the defect generation timing, yield prediction and defect generation source identification, and furthermore a measure for a problematic process are enabled as shown in FIG. 4.

Figure 8:
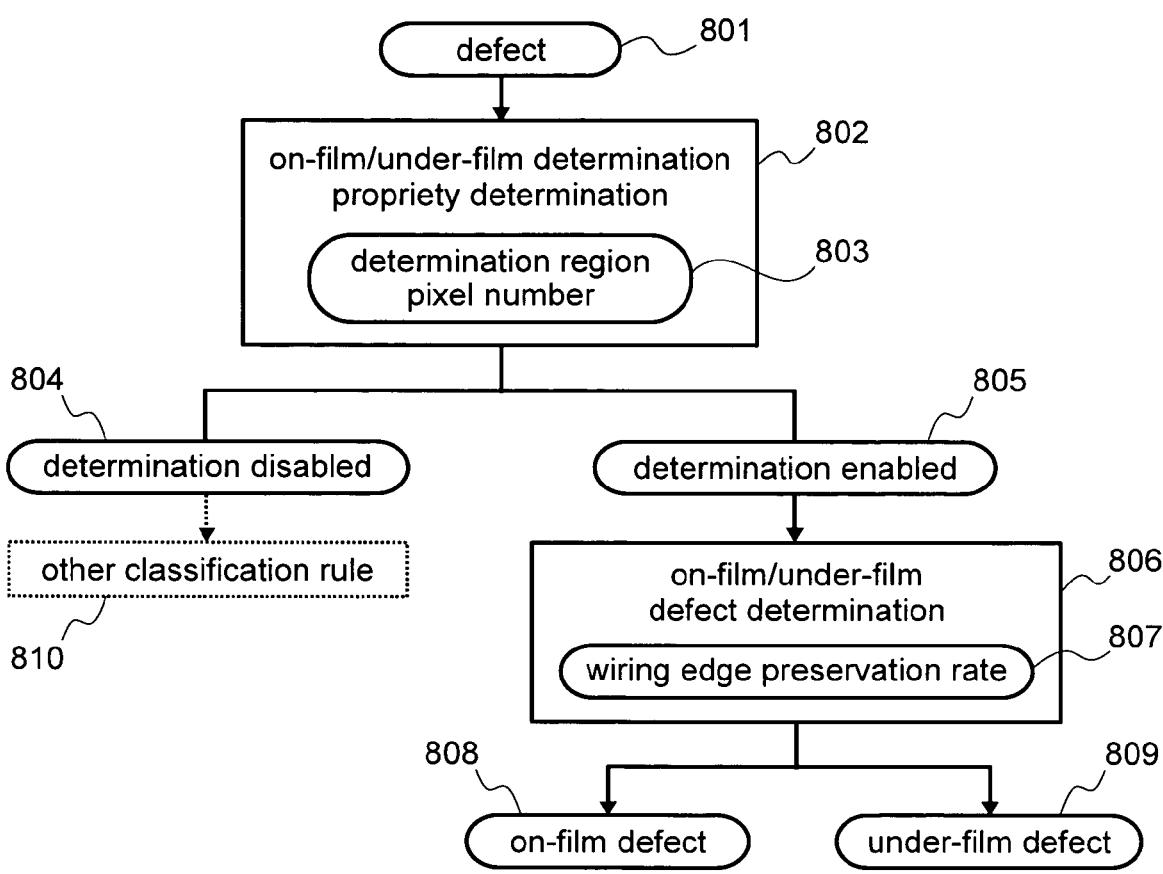
FIG. 8 shows a view showing a flow of defect classification processing.

The classification engine 702 is complementarily described. The classification engine is to classify defects using various classification standards based on a plurality of optional feature quantities. As the classification engine, a rule type classification engine or a learning type classification engine is given, and furthermore a classification engine in an optional combination of a plurality of those classification types may be configured. FIG. 8 shows an example of the on-film/under-film defect classification using the rule type classification engine. A defect 801 (including a case that the defect is previously classified into an optional defect class by an optional classification engine) is subjected to on-film/under-film determination propriety determination 802. In the on-film/under-film determination propriety determination 802, defects are classified into determination disabled 804 or determination enabled 805 based on the determination region pixel number 803.

The defect classified into determination disabled 804 can be classified into another optional defect classification class including the on-film/under-film defect classification using another classification rule 810 as necessary. On the other hand, defects determined to be classification enabled are subjected to on-film/under-film defect determination 806 using the line edge preservation rate 807, so that the defects are classified into on-film defects 808 or under-film defects 809. Furthermore, the on-film defects 808 and the under-film defects 809 can be classified into further detailed classification classes using another optional classification engine (not shown). According to the determination propriety determination, a sample being hard to be classified by the on-film/under-film defect classification method in an embodiment of the invention is classified to be determination disabled, thereby purity of accuracy rate of the on-film/under-film defect classification can be improved. Furthermore, processing branch can be efficiently performed, in which a sample being hard to be classified is classified by a different classification method.

To realize the on-film/under-film defect classification (classification into 3 classes of on-film, under-film and determination disabled) with the determination propriety determination in the previous section, reliable extraction of the determination region, and line edge preservation determination in the determination region are required.

An embodiment of the invention provides an on-film/under-film defect classification method being robust to the following four variation factors.

(1) Defocusing or noises in a SEM image.

(2) Variation in texture (pattern) of a defect surface.

(3) Variation in brightness value of an image caused by difference in scattering condition of an electron beam due to presence of a defect or a shape of the defect.

(4) Deformation of a shape of an edge of a peripheral line pattern by a defect.

Next, two items of the extraction of the determination region and the preservation determination of the line edge in the determination region are described in this order.

2. 2. 3. Determination Region Extraction

Figure 9:
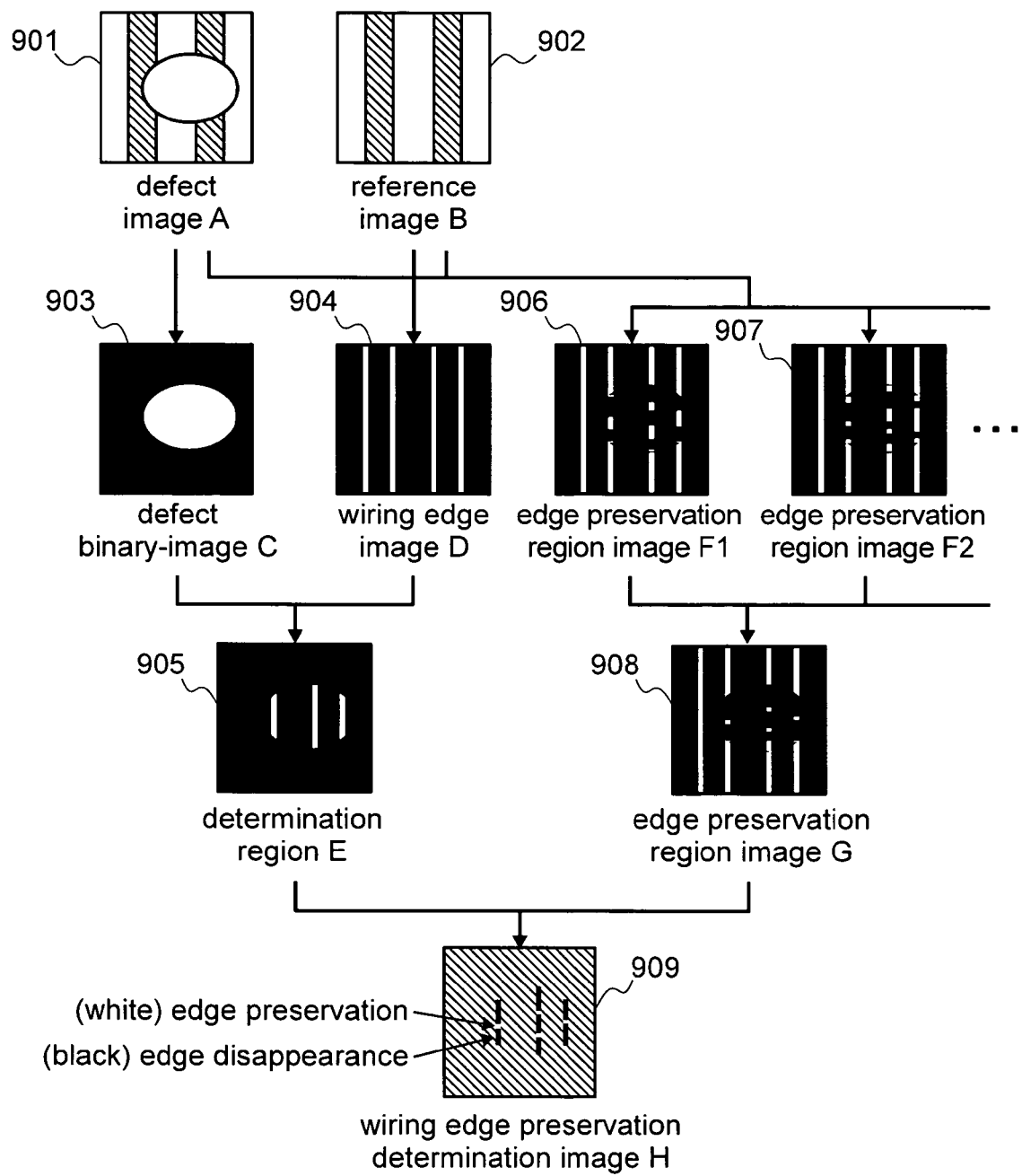
FIG. 9 shows a view showing processed images in the defect classification processing and a flow of the processing.

A calculation procedure of a line edge region (determination region) in a defective region, which is to be subjected to the line edge preservation determination, is described using A to E in FIG. 9. First, a defect image A (a particle on-film defect shown by an ellipse exists in the center) and a reference image B are taken as input information, and a defect binary-region C is detected by comparison checking between them. Here, the reference image is an image of a normal region having the same design pattern in an adjacent chip with respect to a defect imaging position. However, instead of use of the reference image, there may be variations such as use of a defect-free image synthesized from a defect image based on continuity of a pattern or the like, or use of an image of a normal region which was previously taken and stored. In that case, the step 2009 of taking the reference image in high magnification can be omitted in FIG. 2(*c*). Moreover, while the reference image B in FIG. 9 is an image in high magnification, an image obtained according to similar processing can be used for an image in low magnification instead of the reference image, and in that case, the step 2003 of taking the reference image in low magnification can be omitted in FIG. 2(*c*).

As a method of identifying a defective region only from a defect image, a method described in JP-A-2003-98114 is given, wherein a brightness value of a normal pattern is estimated based on continuity of a surrounding pattern in the defective region identified herein, thereby a reference image can be estimated without actual imaging. While image shift is not seen between the defect and reference images in FIG. 9, when positional shift between the images is calculated as preprocessing, and when pixel values are compared between the images, processing of comparing pixels corresponding to each other is performed in consideration of the shift. Then, the logical product between the defect binary-region C and a line edge image D detected from the reference image B is obtained, thereby a determination region E (white pixels in 905) is obtained.

However, in the determination region extraction method, accurate determination region extraction is difficult against the "(3) variation in brightness value of an image caused by difference in scattering condition of an electron beam due to presence of a defect or a shape of the defect". That is, while calculation of the determination region requires accurate extraction of a defective region corresponding to presence of a defect or change in shape of a pattern, in some cases, the defective region can not be accurately estimated due to difference in edge effect caused by presence of a defect or a shape of the defect such as a defect binary-image C (1001) as exemplified in FIG. 10(*a*). While the defect binary-image C (1001) of FIG. 10(*a*) is an example of a defective region estimated from the defect image A (901) and the reference image B (902) in FIG. 9, when it is compared to the accurate defect binary-image C (903) shown in FIG. 9, it is known that line edge portions are remained as pseudo defects. In this case, the remnant is not a defect, and when the defect binary-image C (1001) is subjected to line edge preservation determination as described later, the remnant is determined as edge preservation of a defect portion, which significantly reduces accuracy in calculation of a preservation rate. While the example is an example of an on-film defect, particularly when a similar remnant is produced for an under-film defect, a line edge preservation rate becomes large compared with an actual rate, causing erroneous determination on on-film/under-film defect classification.

Figure 10A:
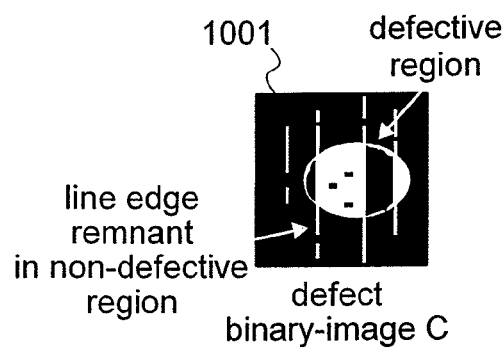
FIG. 10(a) shows a view showing a defective region detected by comparison checking, which represents a condition that a line edge portion is remained as a pseudo defect.
Figure 10B:
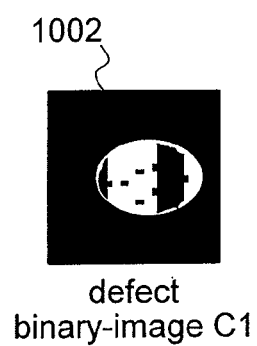
FIG. 10(b) shows a view showing a condition that a remnant portion of a line edge is excellently removed.
Figure 10C:
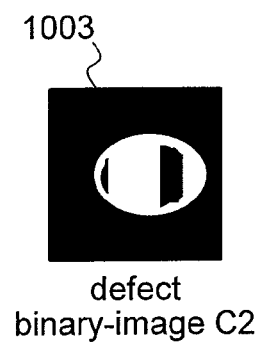
FIG. 10(c) shows a view showing a result of image processing such that the remnant portion of the line edge is eliminated, and a line edge portion included in a true defective region is included in a defect.
Figure 11A:
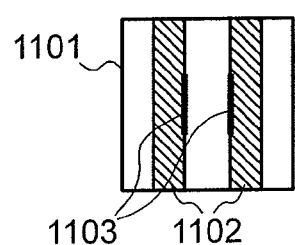
FIG. 11(a) shows a view showing a reference image in processing of detecting a deformed line pattern.
Figure 11B:
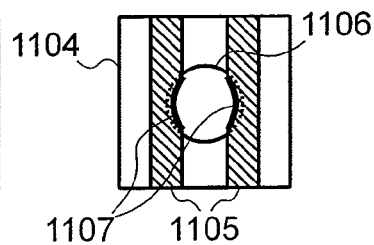
FIG. 11(b) shows a view showing a defect image in the processing of detecting the deformed line pattern.

Thus, in an embodiment of the invention, the remnant portion which is essentially not a defective region is removed, from the defective region. As such a method, preservation determination of line edges as described later is performed, then a region where the edges are preserved between the defect and reference images (white regions in edge preservation region image G (908) in FIG. 9) is removed from the defect binary-image C (1001), thereby detection accuracy of the defective region is improved. According to such processing, a defect binary-image C1 (1002) can be detected, in which only the remnant portion of the line edges are excellently removed. However, since such processing also removes a line edge portion included in a true defective region in an under-film defect, it is inconvenient for the line edge preservation determination as described later (a determination region E (905) disappears). Thus, for example, a defective region in the defect binary-image C1 (1002) is subjected to expansion processing, thereby a defect binary-image C2 (1003) is obtained, in which the remnant seen in the differential binary image C (1001) is not included in a defect, and line edge portions included in the true defective region is included in the defect. The defect binary-image C2 (1003) corresponds to the defect binary-image C (903) in FIG. 9. Remnant removal processing of FIG. 10 is combined with processing of FIG. 9 in this way, thereby processing being robust to variation in image brightness value is realized.

Since such processing of removing the remnant of line edges, which is essentially not the defective region, lead to improvement in defect detection accuracy, the processing leads to realizing not only improvement in accuracy of on-film/under-film defect classification, but also improvement in accuracy of defective region imaging, defect size measurement, calculation of the image feature quantity of the defective region, and defect classification in typical ADR or ADC.

The number of pixels (number of white pixels in 905) can be used as an image feature quantity 703 in FIG. 7 as described before, or used as an index value 803 for on-film/under-film defect determination propriety determination in FIG. 8.

The improvement in detection accuracy of the defective region by using the line edge remnant removal processing may cause a trouble in detection of a VC (Voltage Contrast) defect as an electric defect inherent in a lower layer of a wafer. That is, the VC defect may induce a phenomenon that only edge portions of a pattern become bright or dark compared with a brightness value of a normal pattern due to short or open between line lines in an underlying pattern, and the line edge remnant removal processing has risk of removing such a VC defect from the defective region. Therefore, the remnant removal processing is selectively used for each defect type being desired to be detected.

Figure 12:
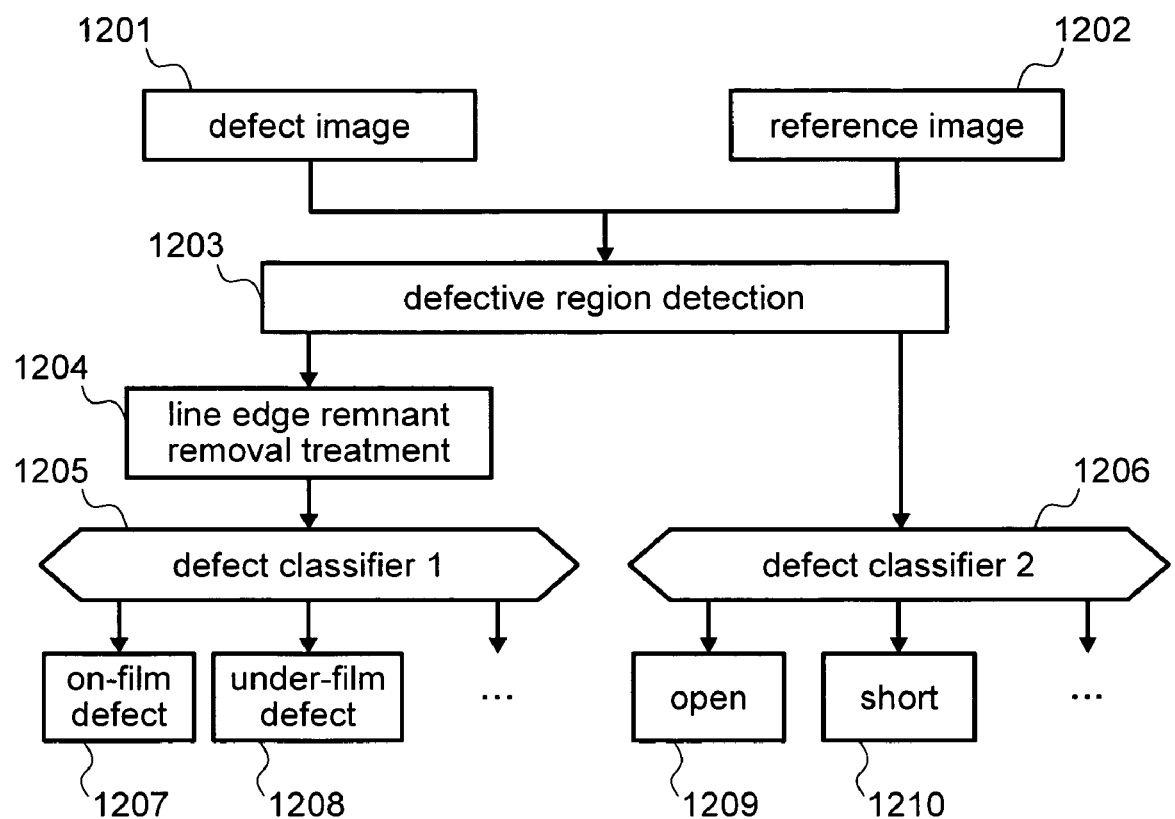
FIG. 12 shows a view showing a flow of selectively performing remnant removal processing in a defective region.

FIG. 12 shows an example of selective use of the remnant removal processing. First, a defective region is detected from a defect image (1201) and a reference image (1202) in step 1203. The remnant removal processing is performed to the defective region in step 1204, then defect classification is performed to a brightness pattern in a calculated defective region (1205), and then defects are classified into defect classes including an on-film defect 1207 and an under-film defect 1208. On the other hand, defect classification is performed to a brightness pattern in a defective region that is not subjected to the remnant removal processing (1206), and then defects are classified into defect classes including an open defect 1209 and a short defect 1210.

2.2.4. Line Edge Preservation Determination

A line edge preservation determination method in the determination region E extracted by the above method is described using A, B, F1, F2, ..., G and H in FIG. 9. While determination is performed only to pixels in the determination region, the figure shows a result of processing to the whole visual field for description.

An embodiment of the invention performs edge preservation determination combining preservation determination based on a plurality of evaluation indexes J1 to JN (N≧1) for determining whether line edges are preserved between reference and defect images. FIG. 9 shows edge preservation region images F1, F2, ... using references 906, 907, ..., in which regions are shown by white, the regions having been subjected to line edge preservation determination using the evaluation indexes J1, J2, ... in each pixel (x, y), and determined to have line edges preserved therein (F3 and later are not shown). The reason for preparing a plurality of evaluation indexes in this way is that since a texture exists also on a defect surface in the line edge preservation determination, even if the line edge preservation determination is simply performed using only one evaluation index between corresponding pixels between defect and reference images, risk of erroneous determination is high. Thus, for example, the edge preservation region image G obtained by the logical product of the edge preservation region images F1, F2, ... is used for final edge preservation determination, thereby accurate edge preservation determination is realized. That is, it is defined as a preservation condition of line edges that a plurality of edge preservation standards are satisfied.

As a specific example of the evaluation index, preservation determination of edge intensity P(x, y) at corresponding pixels between reference and defect images in a determination region Γ is given. That is, by using a property that a brightness value tends to significantly change with respect to peripheral pixels in a line edge portion, a pixel, in which the edge intensity P(x, y) has a threshold value $I_{MIN}$ or more in both the reference and defect images, is assumed as a preservation region of a line edge. The edge intensity P(x, y) can be calculated, for example, by using a Sobel edge filter or a Laplacian edge filter, and furthermore a type or size of the edge filter can be changed depending on a brightness pattern caused by difference in image (SEM image or optical image) or difference in imaging magnification.

As another specific example of the evaluation index, preservation determination of an edge direction θ(x, y) (θ(x, y) is a relative angle, for example, assuming that an x-axis direction is 0°) in corresponding pixels between reference and defect images is given. That is, since a line edge portion has a tendency that a brightness value significantly changes with respect to a particular direction, by using a property that if similar line edge portions are preserved between reference and defect images, the directions are similar in both the images, pixels, in which difference in edge direction θ(x, y) between the reference and defect images is a certain threshold value $D_{MAX}$ or less, are assumed as the line edge preservation region. The edge direction θ(x, y) can be also calculated by using a Sobel edge filter or a Laplacian edge filter.

As another specific example of the evaluation index, an optional combination of feature quantities and/or determination methods of evaluating a brightness pattern of an image, such as brightness of the image or a differential value between left and right, two shading images, can be given.

Such determination processing using a plurality of different determination conditions enables controlling a case that an accidental edge due to a texture or the like is erroneously determined to be preserved in separate determination, and thus enables accurate removal of an edge due to a texture on a defect from a preserved image. Similarly in the edge preservation region image G, line edges preserved on the on-film particle are few compared with a preservation determination result separately determined from each of the edge preservation region images F1, F2, ..., and an excellent determination result is obtained.

An image of the edge preservation region image G masked with the determination region E is assumed to be a line edge preservation determination image H. Assuming that the number of pixels in which edges are preserved in the image H is $n_p$ (number of white pixels in the image H), a line edge preservation rate $r_p$ can be defined as a ratio of the $n_p$ to the number of pixels in the determination region (number of white pixels in 905). The line edge preservation rate obtained herein can be used as the index value for the on-film/under-film defect determination in FIG. 7, or the image feature quantity in FIG. 8 as described before.

According to the basic idea for classifying the on-film/under-film defects, when a line edge is deformed by an under-film defect, the edge needs to be determined to be preserved. However, in the edge preservation determination method, accurate edge preservation determination is difficult against the "(4) deformation of a shape of an edge of a peripheral line pattern due to a defect". This is described using on-film/under-film defect determination, which employs a reference image 1101 (1102 indicates line patterns) shown in FIG. 11(a) and a defect image 1104 (1105 indicates line patterns, and 1106 indicates an under-film defect) shown in FIG. 11(b), as an example. When the circular under-film defect 1106 shown in FIG. 11(b) exists, since a region where the under-film defect exists is raised, portions 1107 (emphatically indicated by thick lines) of the line patterns 1105 overlapping with such defective region are sometimes deformed (line edges are horizontally expanded in the figure). Therefore, even if line edge preservation determination is performed in determination regions 1103 (line edge regions existing in a region corresponding to the defective region 1106 in the reference image, which corresponds to the determination region E (white pixels) in FIG. 9) being emphatically indicated by thick lines in FIG. 11(a), since the line edges in the defective region are deformed as shown in 1107, the line edges do not exist in places corresponding to the determination regions 1103, and therefore the line edges can not be determined to be preserved.

Thus, processing is allowed to be added, the processing is processing that the line edge preservation determination is performed similarly to the periphery of a focused pixel on the defect image to be determined, and when a peripheral pixel satisfying a preservation determination condition exists, edges are determined to be preserved in the focused pixel. That is, processing of searching line edges, which are not situated in corresponding positions between defect and reference images, by periphery search is added. A range of the periphery search can be optionally set depending on a level of possible change in line edge.

A distribution view 1301 in FIG. 13(a) shows a result plotted with edge preservation rates calculated in several samples as a horizontal axis and the determination region pixel number as a vertical axis. In the view, samples having classification answers of on-film, under-film, and determination-disabled (such as isolated particle) are shown by □, ○, and Δ respectively. The samples of the on-film, under-film, and determination-disabled are approximately localized in regions shown by dot lines 1302, 1303 and 1304 respectively, and for example, as shown in the view, 3 classes of the on-film, under-film, and determination-disabled can be excellently separated by using a boundary line 1305 obtained by setting a threshold value on determination propriety as $T_{PI}$, and a boundary line 1306 obtained by setting a threshold value on on-film/under-film determination as $T_{SE}$.

3. GUI Display

GUI (Graphic User Interface) for performing input of various processing parameters in image processing of an embodiment of the invention and display of a processing result is described using FIGS. 13(*a*) to 13(*e*). In FIG. 13(*a*), the distribution view 1301 of the edge preservation rate and the determination region pixel number, and boundary lines 1305 and 1306 for class classification can be displayed.

As shown in wafer display 1307 in FIG. 13(*b*), positions of defects on a wafer and a classification result of the defects can be displayed in a set. The on-film, under-film, and determination-disabled of defective samples are indicated by □, ○, and Δ respectively in both of FIGS. 13(*a*) and 13(*b*), and a classification result of on-film, under-film, and determination-disabled according to teaching from a user, or a classification result of on-film, under-film, and determination-disabled, which were automatically classified by a classification method of an embodiment of the invention, can be indicated as such indication.

As shown in wafer display 1308 in FIG. 13(*c*), positions of defects on a wafer and an estimation result of generation timing of the defects can be displayed in a set. In the wafer display 1308, each defect position is indicated by a square (□), and ID of generation timing of a defect is indicated within the square. For example, the ID indicates "before forming the pattern A: 1", "during forming the pattern A: 2", or "after forming the pattern A: 3" for a pattern A having optional defect generation timing. Among defective samples, a sample written with two kinds of ID such as "12" is sometimes given (this case shows that generation timing of a defect is either "before forming the pattern A: 1" or "during forming the pattern A: 2").

Various image processing parameters of image processing of an embodiment of the invention or a threshold value for determining whether a defect is on-film, under-film, or determination-disabled can be specified and displayed in 1309 of FIG. 13(*d*). A mark *** in the figure shows that any optional numeral values are inputted or displayed.

By selecting an optional sample in the distribution view 1301 or on the wafer display 1307 and 1308, a defect image or processed image of the sample can be displayed in a window 1310 shown in FIG. 13(*e*). While displayed images are a defect image A, reference image B, and line edge preservation determination image H in the figure, an image group of A to H shown in FIG. 9 can be displayed in any optional combination. Moreover, as shown in 1311, the determination region pixel number calculated in each sample or a value of the edge preservation rate can be displayed.

GUI display shown in FIGS. 13(*a*) to 13(*e*) can be displayed side by side on one screen in any optional combination at the same time.

Figure 14A:
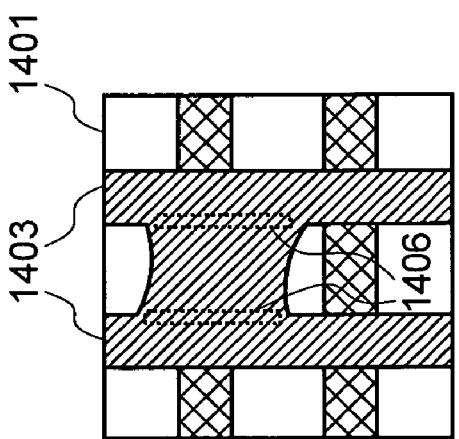
FIG. 14(a) shows a view showing a reference image (normal pattern)
Figure 14B:
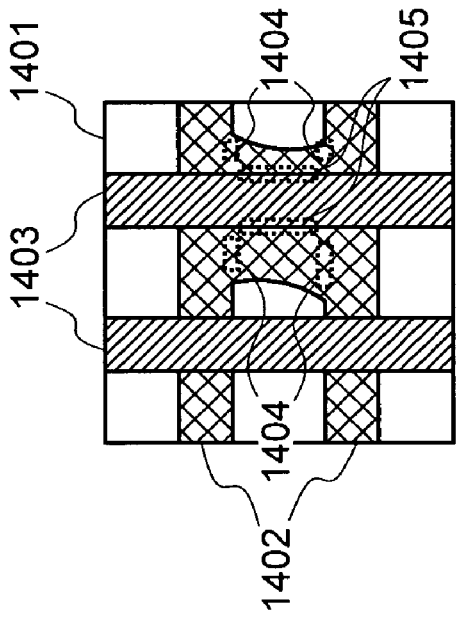
FIG. 14(b) shows a view showing an image of a pattern defect in which an underlying line pattern is shorted.
Figure 14C:
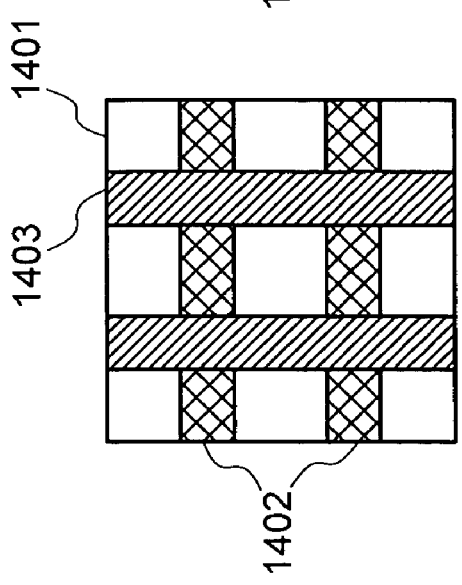
FIG. 14(c) shows a view showing an image of a pattern defect in which an overlying line pattern is shorted.
Figure 15A:
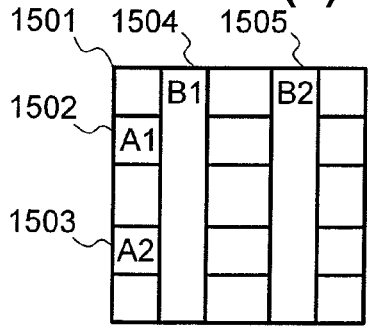
FIG. 15(a) shows a view of a reference image of a two-layer line pattern in which line patterns B1 and B2 are formed on line patterns A1 and A2.
Figure 15B:
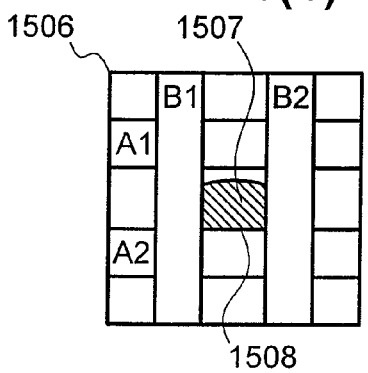
FIG. 15(b) shows a view of a defect image in a condition that a particle defect exists under the line pattern A2.
Figure 15C:
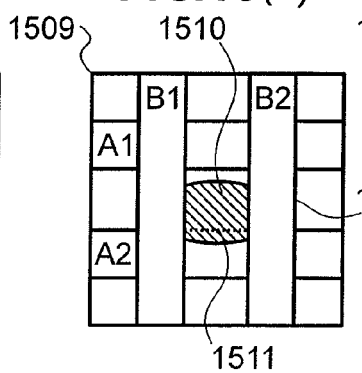
FIG. 15(c) shows a view of a defect image in a condition that a particle defect exists on the line pattern A2 and under the line patterns B1 and B2.
Figure 15D:
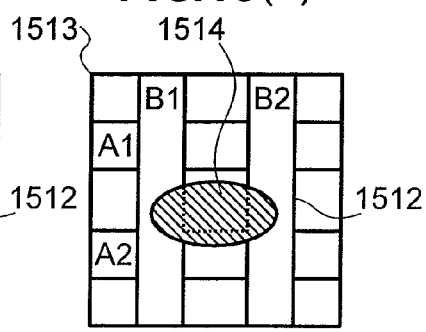
FIG. 15(d) shows a view of a defect image in a condition that a particle defect exists on the line patterns B1 and B2.
Figure 15E:
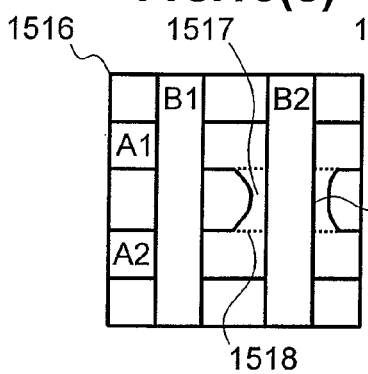
FIG. 15(e) shows a view of a defect image in a condition that the line patterns A1 and A2 are shorted.
Figure 15F:
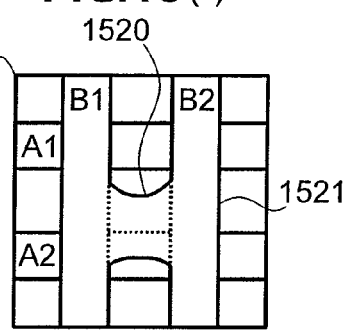
FIG. 15(f) shows a view of a defect image in a condition that the line patterns B1 and B2 are shorted.
Figure 15G:
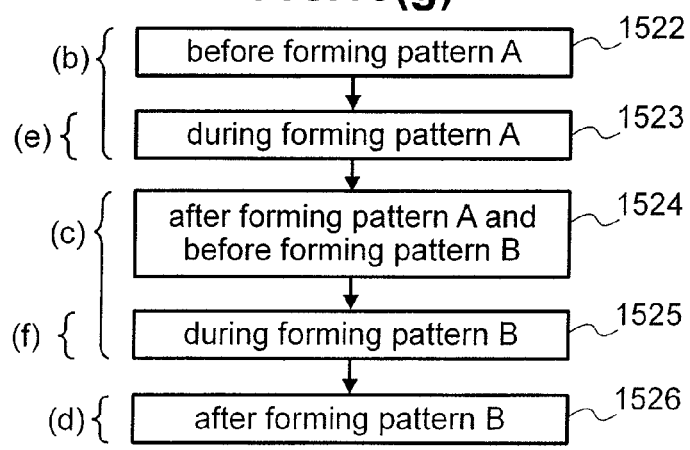
FIG. 15(g) shows a flowchart showing steps of forming the pattern A and pattern B in steps of manufacturing a semiconductor device in an extracted manner.

The on-film/under-film defect classification including the determination propriety determination described in an embodiment of the invention can be used for not only a top down SEM image, but also a tilt observed-image or a back-scattered electron image acquired by deflecting the electron beam or inclining the stage. Moreover, it can be used for not only the image acquired by SEM, but also an inspected image acquired by a light microscope. Furthermore, regarding defects to be classified, the classification is not limited to be used for the particle defects, and can be used for other types of defects. FIGS. 14(*a*) to 14(*c*) show an example of a pattern defect as an example of the defects.

FIGS. 14(*a*) to 14(*c*) schematically show a reference image (normal pattern), defect image (a pattern defect in which underlying line patterns 1402 are shorted), and defect image (a pattern defect in which overlying line patterns 1403 are shorted) in this order in a pattern where line patterns in vertically two layers are observed. In FIG. 14(*b*), while edges are not preserved at boundaries 1404 between shorted defective regions and the underlying line patterns 1402, edges are preserved at boundaries 1405 between the defective regions and the overlying line patterns 1403, consequently such defects are estimated to be generated during forming the underlying line patterns 1402 (compared with the on-film/under-film defects, the defects can be called embedded (in-film) defects with respect to the underlying line patterns 1402). On the other hand, in FIG. 14(*c*), edges are not preserved at boundaries 1406 between shorted defective regions and the overlying line patterns 1403, consequently such defects are estimated to be generated during forming the overlying line patterns 1403 (the defects can be called embedded defects with respect to the overlying line patterns 1403).

An embodiment of the invention identifies the defect classification class (defect type) such as on-film/under-film or particle defect/pattern defect as shown in FIG. 7, in addition, identifies defect generation timing. FIGS. 15(*a*) to 15(*g*) show an example of identifying the defect generation timing. FIG. 15(*a*) shows a reference image 1501 having two line patterns 1502 and 1503 (called A1 and A2 respectively, and A1 and A2 are collectively called pattern A) in a lower layer, and having two line patterns 1504 and 1505 (called B1 and B2 respectively, and B1 and B2 are collectively called pattern B) in an upper layer. FIGS. 15(*b*) to 15(*f*) show variation examples of possibly generated defects with respect to a normal pattern such as the reference image 1501. FIGS. 15(*b*) to 15(*d*) show defect images (1506, 1509 and 1513 respectively) in which particle defects shown by oblique lines (1507, 1510 and 1514 respectively) are adhered, respectively, and FIGS. 15(*e*) and 15(*f*) show defect images (1516 and 1519 respectively) in which short defects (1517 and 1520 respectively) as one of the pattern defects are generated, respectively. Regarding the particle defects 1507, 1510 and 1514, since adhesion timing is different in a stacked direction in FIGS. 15(*b*) to 15(*d*), they differently appear from one another because of being covered with the upper layer pattern, however, all the particle defects 1507, 1510 and 1514 have the same shape (a shape being not covered is 1514). Moreover, in FIGS. 15(*b*) to 15(*f*), dot lines represented by 1511, 1515, 1518 and 1521 show line edges that can not be observed or disappear because of generation of the particle defects or the short defects though they were observed in the reference image shown in FIG. 15(*a*).

FIG. 15(*g*) shows steps of forming patterns A and B extracted from a semiconductor manufacturing process. As known from the reference image 1501, the patterns A and B are sequentially formed in a stacked direction. At the left of each of steps 1522 to 1526 of FIG. 15(*g*), ID of a defect image, in which a defect is estimated to be generated in a corresponding step, is shown. IDs (b) to (f) written at the left of the steps 1522 to 1526 correspond to the defect images shown in FIGS. 15(*b*) to 15(*f*), respectively.

For the defect images of FIGS. 15(*b*) to 15(*f*), defect generation timing is estimated as follows.

For the particle defect 1507 in FIG. 15(*b*), since the line edge 1508 of the underlying line pattern A2 is preserved (observation enabled), the defect is estimated to be generated before forming the pattern A (step 1522 in FIG. 15(*g*)) or during forming the pattern A (step 1523).

For the particle defect 1510 in FIG. 15(*c*), since the line edge 1511 of the underlying line pattern A2 is not preserved (observation disabled), and the edge 1512 of the overlying line pattern B2 is preserved, the defect is estimated to be generated after forming the pattern A and before forming the pattern B (step 1524), or during forming the pattern B (step 1525).

For the particle defect 1514 in FIG. 15(*d*), since the line edge 1515 of the overlying line pattern B2 is not preserved, the defect is estimated to be generated after forming the pattern B (step 1526).

For the short defect 1517 in FIG. 15(*e*), since the line edge 1518 of the underlying line pattern A2 is not preserved, the defect is estimated to be generated during forming the pattern A (step 1523).

For the short defect 1520 in FIG. 15(*f*), since the line edge 1521 of the overlying line pattern B2 is not preserved, the defect is estimated to be generated during forming the pattern B (step 1525).

As described before, regarding estimation of defect generation timing, the defect generation timing can be identified, or narrowed into several candidates of the defect generation timing. Moreover, as shown in FIGS. 15(*c*) and 15(*e*), even if respective line edges of the underlying patterns A disappear (1511 and 1518 disappear respectively), or even if the defects are under-film defects with respect to the line patterns B respectively, estimation results of the defect generation timing are sometimes different between the particle defect of FIG. 15(*c*) and the short defect of FIG. 15(*e*) (the particle defect of FIG. 15(*c*) is generated in the step 1524 or 1525, and the short defect of FIG. 15(*e*) is generated in the step 1523). In this way, for estimation of defect generation timing, information of a defect type is added in addition to the on-film/under-film determination result. While the particle defect or the pattern defect was given as the defect type in the example, any other defect type can be additionally given.

Moreover, determination of the defect adhesion position or defect generation timing described in an embodiment of the invention is not restrictively applied to an image in which only a line pattern in a single layer can be observed as exemplified in FIG. 5, or an image in which line patterns in 2 layers can be observed as exemplified in FIG. 15, and can be applied to an image in which line patterns in at least 3 layers can be observed in any optional number of layers. While the above example was described applying to the line pattern in a direction perpendicular to x- or y-axis, an embodiment of the invention is not limited to this, and can be applied to any oblique line pattern or curved pattern (including an contact hole) in the same way.

Moreover, the edge preservation determination method described in an embodiment of the invention is widely used effectively as a method of quantifying a correlation value between patterns of two images or a preservation condition of a pattern. While the line edge was focused as an image pattern for evaluating the preservation condition in the described method, the method can be similarly applied to evaluation of a preservation condition of any optional brightness pattern.

While the above example was described using a method and apparatus of reviewing and classifying a defect of a pattern formed on a semiconductor wafer as an example, an embodiment of the invention is not limited to this, and can be used in the case of reviewing a pattern formed on a substrate using a thin film process such as TFT substrate process, magnetic head process, and magnetic disk process.

For early setup and improvement in yield of a semiconductor manufacturing process, identification of a defect generation step or yield prediction in the semiconductor manufacturing process, and furthermore a prompt measure for a problematic process based on such analysis are necessary, and improvement in accuracy of an automatic defect classification technique, which is an important determination source for the analysis, is required. An embodiment of the invention relates to on-film/under-film defect classification as one of the automatic defect classification techniques, and narrowing a range of defect generation timing based on the on-film/under-film defect classification. Analysis using narrowing a range of defect generation timing that is combined with defect distribution information, defect composition information, or apparatus history information as necessary is performed, thereby accurate identification of the problematic process is realized.

The invention may be embodied in other specific forms without departing from the sprit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A method of reviewing a defect, comprising:
   a step of previously performing an inspection for defects on a sample having a pattern formed thereon by different inspection apparatus and, if there is a defect, obtaining position information of the defect, then imaging an inspection region including the defect by use of the position information under a scanning electron microscope (SEM) thereby to acquire a defect image,
   a step of acquiring a reference image that does not include the defect, the reference image being corresponding to the inspection region,
   a step of extracting a defective region by comparing the defect image to the reference image,
   a step of extracting a line edge on the reference image existing in a region corresponding to the extracted defective region,
   a step of extracting a line edge on the defect image existing in a region corresponding to the line edge, and
   a step of determining a vertical relationship between the defect and the pattern on the sample from the line edge on the reference image and the line edge on the defect image.

2. The method of reviewing the defect according to claim 1, further comprising:
   a step of estimating generation timing of a defect or narrowing a range of the generation timing in a manufacturing process based on a determination result of the vertical relationship with the pattern and information of a defect type.

3. The method of reviewing the defect according to claim 1, wherein the reference image is an image obtained by imaging a region on the sample, which was designed to have essentially the same appearance as that of a circuit design pattern in the inspection region, by the scanning electron microscope (SEM), or a defect-free normal image estimated from the defect image, or an image of a normal region which was previously taken and stored.

4. The method of reviewing the defect according to claim 1, wherein in the step of determining the vertical relationship between the defect and the pattern, the vertical relationship between the defect and the pattern is determined from the line edge on the reference image and the line edge on the defect image based on a ratio of preservation of the line edge between the defect image and the reference image in the defective region.

5. The method of reviewing the defect according to claim 4, wherein the ratio of preservation of the line edge between the defect image and the reference image is determined on condition that both of edge intensity and an edge direction are preserved in one of an optional focused pixel on the reference image, and a pixel in the defect image corresponding to the focused pixel or a peripheral pixel of the pixel.

6. The method of reviewing the defect according to claim 1, wherein in the step of determining the vertical relationship between the defect and the pattern, a region where the line edge is preserved between the defect image and the reference image in the extracted defective region is removed from the defective region.

7. The method of reviewing the defect according to claim 1, wherein in the step of determining the vertical relationship between the defect and the pattern, the line edge on the reference image existing in the region corresponding to the extracted defective region is extracted, and propriety of determination of the vertical relationship between the defect and the pattern on the sample is determined based on the number of pixels of the line edge.

8. Apparatus of reviewing a defect, comprising:
a storage unit that stores position information of a defect on a sample having a pattern formed thereon, the defect being previously detected by inspecting the sample by different inspection apparatus,
a scanning electron microscope (SEM) that takes images of an inspection region including the defect by using the position information of the defect on the sample stored in the storage unit, in order to obtain a defect image and a reference image, and
an image processing unit that processes the defect image acquired by the scanning electron microscope, and a reference image obtained from a comparative region that does not include the defect, the reference image being designed to have essentially the same appearance as that of an inspection region on the sample;
wherein the image processing unit extracts a defective region by comparing the defect image to the reference image, extracts a line edge on the reference image existing in a region corresponding to the extracted defective region, extracts a line edge on the defect image existing in a region corresponding to the line edge, and determines a vertical relationship between the defect and the pattern on the sample from the line edge on the reference image and the line edge on the defect image.

9. The apparatus of reviewing the defect according to claim 8, wherein the image processing unit estimates generation timing of a defect or narrows a range of the generation timing in a manufacturing process based on a determination result of the vertical relationship with the pattern and information of a defect type.

10. The apparatus of reviewing the defect according to claim 8, wherein the reference image to be processed by the image processing unit is an image obtained by imaging a region on the sample, the region having been designed to have essentially the same appearance as that of a circuit design pattern in the inspection region, by the scanning electron microscope (SEM), or a defect-free normal image estimated from the defect image.

11. The apparatus of reviewing the defect according to claim 8, wherein the image processing unit determines the vertical relationship between the defect and the pattern based on a ratio of preservation of the line edge between the defect image and the reference image in the defective region.

12. The apparatus of reviewing the defect according to claim 11, wherein the image processing unit determines the ratio of preservation of the line edge between the defect image and the reference image on condition that both of edge intensity and an edge direction are preserved in one of an optional focused pixel on the reference image, and a pixel in the defect image corresponding to the focused pixel or a peripheral pixel of the pixel.

13. The apparatus of reviewing the defect according to claim 8, wherein the image processing unit extracts the defective region by comparing the defect image to the reference image, and removes a region where the line edge is preserved between the defect image and the reference image in the defective region from the defective region.

14. The apparatus of reviewing the defect according to claim 8, wherein the image processing unit extracts the defective region by comparing the defect image to the reference image, extracts the line edge on the reference image existing in the region corresponding to the extracted defective region, and determines propriety of determination of the vertical relationship between the defect and the pattern on the sample based on the number of pixels of the line edge.

* * * * *